(12) United States Patent
Knepler

(10) Patent No.: US 8,482,892 B2
(45) Date of Patent: Jul. 9, 2013

(54) ALTERNATING CURRENT OVERLOAD PROTECTION APPARATUS AND METHOD

(75) Inventor: John T. Knepler, Springfield, IL (US)

(73) Assignee: Bunn-O-Matic Corporation, Springfield, IL (US)

( * ) Notice: Subject to any disclaimer, the term of this patent is extended or adjusted under 35 U.S.C. 154(b) by 0 days.

(21) Appl. No.: 12/919,264

(22) PCT Filed: Mar. 2, 2009

(86) PCT No.: PCT/US2009/035681
§ 371 (c)(1),
(2), (4) Date: May 24, 2011

(87) PCT Pub. No.: WO2009/108920
PCT Pub. Date: Sep. 3, 2009

(65) Prior Publication Data
US 2011/0222198 A1 Sep. 15, 2011

Related U.S. Application Data

(60) Provisional application No. 61/032,225, filed on Feb. 28, 2008.

(51) Int. Cl.
*H02H 3/08* (2006.01)
*H02H 9/02* (2006.01)

(52) U.S. Cl.
USPC ........... 361/87; 361/93.1; 361/93.5; 361/93.9

(58) Field of Classification Search
USPC ................. 361/87, 93.1, 93.5, 93.9
See application file for complete search history.

(56) References Cited

U.S. PATENT DOCUMENTS

| | | | |
|---|---|---|---|
| 3,558,983 A * | 1/1971 | Steen | 361/58 |
| 4,628,397 A | 12/1986 | Gareis et al. | |
| 4,670,830 A * | 6/1987 | Peppel | 363/57 |
| 7,265,531 B2 * | 9/2007 | Stauth et al. | 324/117 H |
| 2005/0007715 A1 | 1/2005 | Mukai et al. | |

OTHER PUBLICATIONS

Int'l Search Report & Written Opinion issued in PCT/US2009/035681 (2009).

\* cited by examiner

*Primary Examiner* — Rexford Barnie
*Assistant Examiner* — Zeev V Kitov
(74) *Attorney, Agent, or Firm* — Barnes & Thornburg LLP

(57) ABSTRACT

A circuit and method protect switching devices from alternating current overload. By protecting the switching devices from AC overload, the reliability of the equipment using the switching devices is improved, cost for repair is decreased and information regarding the cause of the AC overload is available.

25 Claims, 4 Drawing Sheets

US 8,482,892 B2

ALTERNATING CURRENT OVERLOAD PROTECTION APPARATUS AND METHOD

This patent application is a U.S. nationalization under 35 U.S.C. §371 of International Application No. PCT/US2009/035681, filed Mar. 2, 2009, which claims the benefit of priority under 35 U.S.C. §119(e) to U.S. Provisional Application Ser. No. 61/032,225, filed Feb. 28, 2008. The disclosures set forth in the referenced applications are incorporated herein by reference in their entireties, including all information as originally submitted to the United States Patent and Trademark Office.

BACKGROUND

Many electromechanical actuators are powered by an Alternating Current (AC) voltage source. Control of these devices is often accomplished with thyristor switches including triacs and Silicon Controlled Rectifiers (SCRs).

In an illustrated embodiment, a circuit is provided that protects such switching components from damage in case of a severe overcurrent or short circuit resulting from an AC overload. By protecting the switching components from AC overload, the reliability of the equipment using the switching components is improved, cost for repair is decreased, and information regarding the cause of the AC overload may be obtained.

Additional features will become apparent to those skilled in the art upon consideration of the following detailed description of drawings exemplifying the best mode as presently perceived.

BRIEF DESCRIPTION OF THE DRAWINGS

The description particularly refers to the accompanying figures in which.

Figure 1:
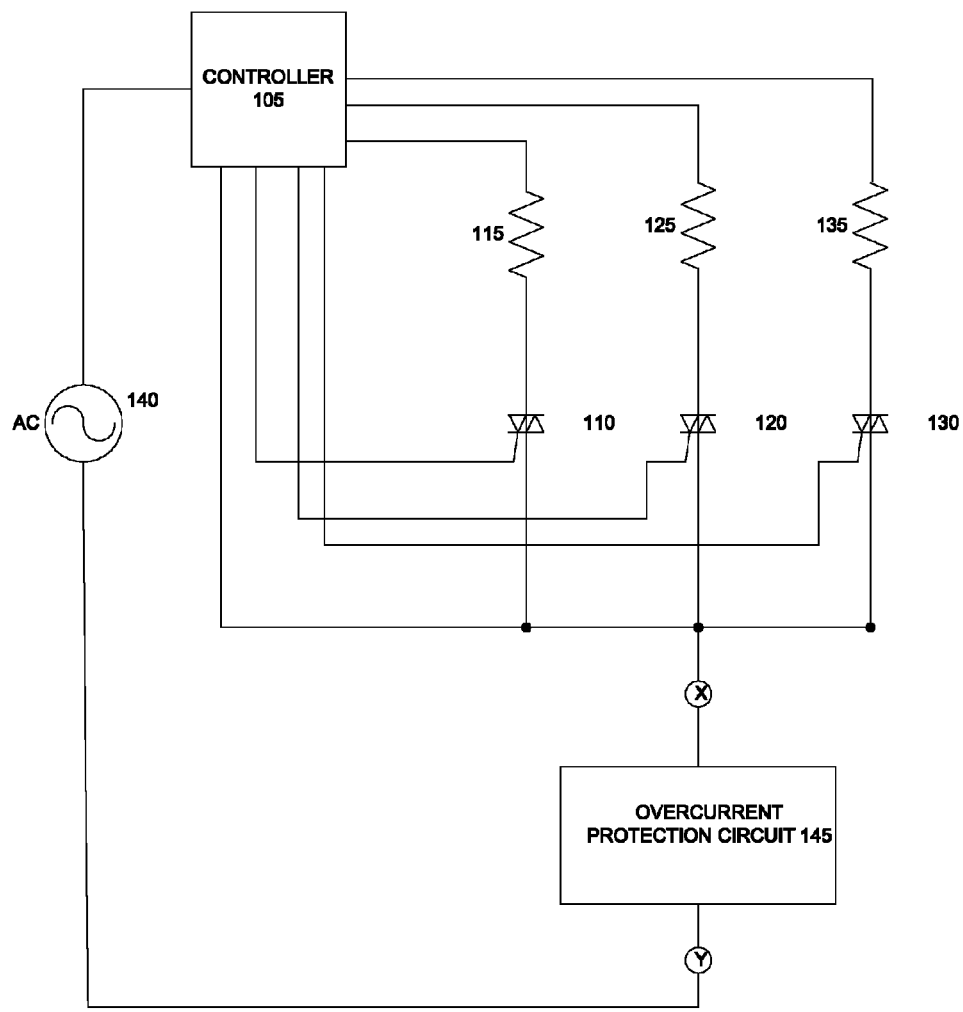
FIG. 1 is a functional circuit diagram illustrating an apparatus utilizing an illustrated embodiment.

While embodiments have been illustrated and described in the drawings and foregoing description, such illustrations and descriptions are considered to be exemplary and not restrictive in character, it being understood that only illustrative embodiments have been shown and described and that all changes and modifications that come within the spirit of the invention are desired to be protected.

DESCRIPTION

While the present disclosure may be susceptible to embodiment in different forms, there is shown in the drawings, and herein will be described in detail, embodiments with the understanding that the present description is to be considered an exemplification of the principles of the disclosure and is not intended to limit the disclosure to the details of construction and the arrangements of components set forth in the following description or illustrated in the drawings.

A well-known characteristic of thyristors is their ability to handle very high currents for a short time without suffering damage. For instance, a triac rated for 4 amps continuous current can tolerate a one-time surge of 30 amps that lasts for 20 milliseconds. Much larger currents can be survived if the duration is shortened further. Accordingly, the illustrated embodiments provide a mechanism and operations for protecting thyristors against overcurrent.

With reference to FIG. 1, an illustrated embodiment provides an overcurrent protection circuit 145 placed in series with the thyristors 110, 120, 130 to be protected. As explained in connection with FIG. 2, this overcurrent protection circuit 145 includes another switching device 205. In accordance with an illustrated embodiment, the switching device may be a transistor or Field Effect Transistor (FET) or any component with like functionality. It should be appreciated that the overcurrent protection circuit 145 can be placed either in the supply or return side of the power source 140.

As should be readily apparent from FIG. 1, the controller circuit 105 also loses power when overcurrent of the thyristors 110, 120, 130 occurs. The controller circuit 105 can be configured to reset and remove command signals from the thyristors 110, 120, 130 after a power interruption. This functionality prevents repeated cycling of shorted loads (115, 125, 135) because power may be restored within seconds after shutting down due to an original short. Alternatively, the controller circuit 105 may be configured to retain power (e.g., including of coupled to a backup power source) and an auxiliary control signal (such as that generated by microcontroller 230 described in connection with FIG. 2) may be used to reset the controller circuit 105.

Figure 2:
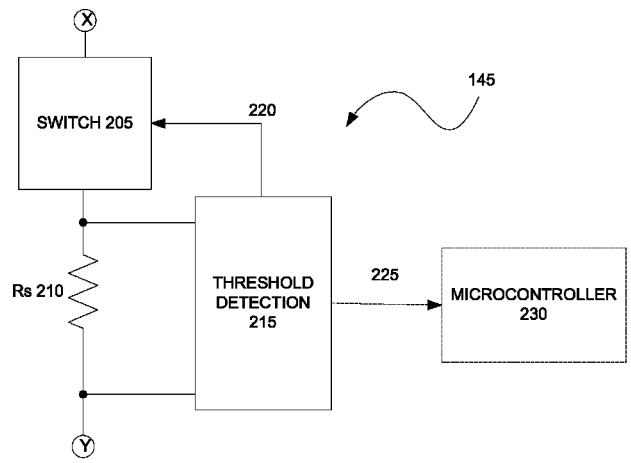
FIG. 2 is a more detailed functional circuit diagram illustrating a portion of the overcurrent protection circuit in accordance with illustrated embodiments.

As illustrated in FIG. 2, the switch 205 is provided in combination with resistance in the form of resistor Rs 210 and a threshold detection circuit 215, which is configured to detect the current flowing through the switch 205. This current detection is performed by simply measuring the voltage experienced by the threshold detection circuit (and, under Ohm's law, the resistance Rs 210); as a result of knowing both the resistance and the voltage, the current flowing through Rs may be determined. In turn, based on Ohm's law, an indication of the current experienced by both the switch 205 and the thyristors 110, 120, 130 illustrated in FIG. 1 may also be known. Accordingly, the threshold detection circuit 215 may provide an indication of whether and when the thyristors 110, 120, 130 are experiencing overcurrent.

The switch 205 cannot be thyristor; this is because, inherently, thyristors cannot achieve a rapid turn-off. Thus, another DC switching device, such as a FET or transistor, must be used. In order to switch AC using a DC device, it is necessary to implement a bridge rectifier circuit as shown in FIG. 3, described below.

The threshold detection circuit 215 outputs a control signal 220 to the switch 205 in a feedback manner such that the switch operation is controlled by the controls signal 220. Thus, the threshold detection circuit 215 may be configured to control the circuit 205 to open, thereby ceasing operation of the circuit illustrated in FIG. 1, and protecting against overcurrent induced damage of the thyristors 110, 120, 130.

Figure 4:
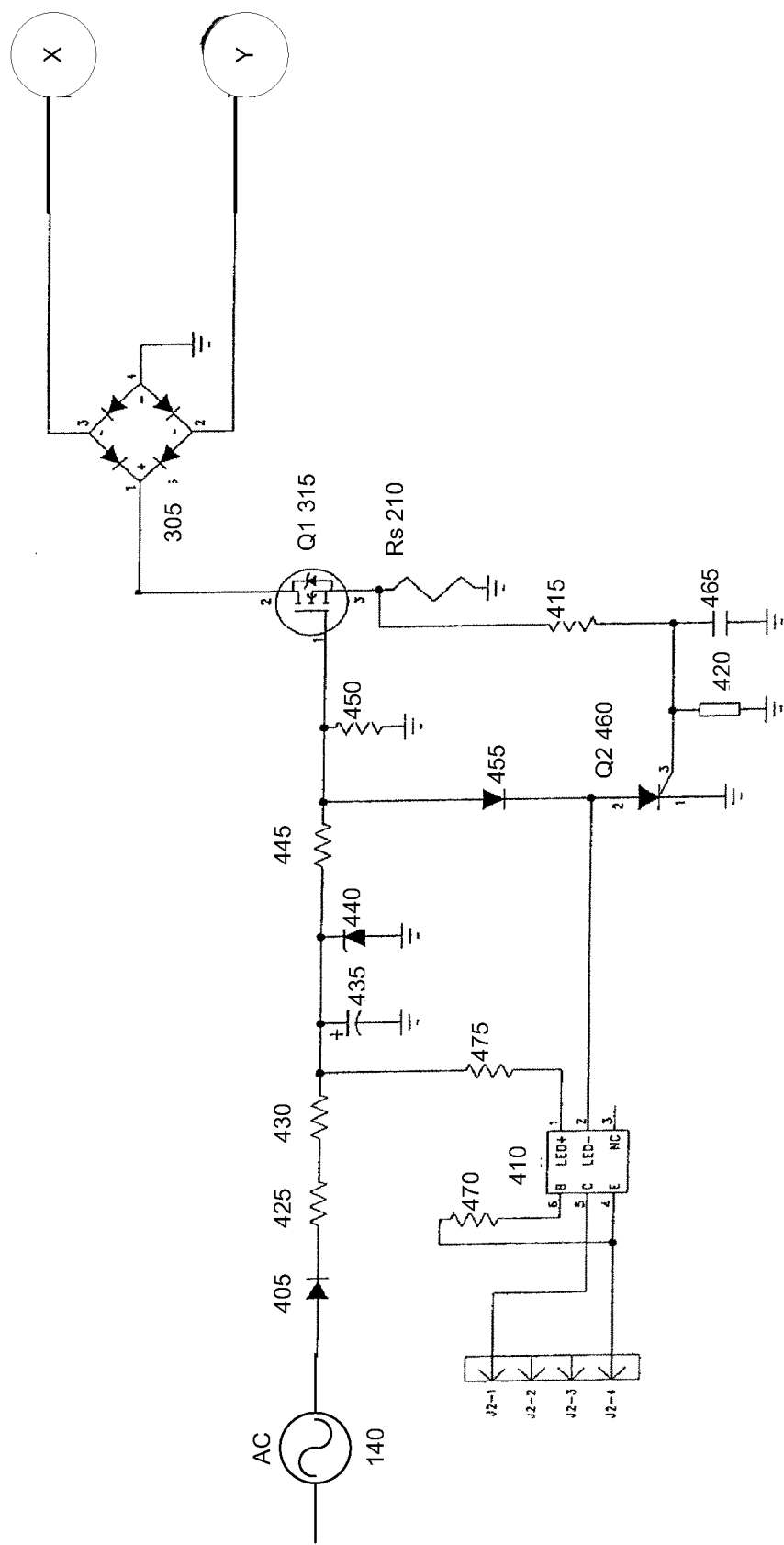
FIG. 4 is a schematic circuit diagram illustrating the overcurrent protection circuit in accordance with an illustrated embodiment.

In accordance with at least one illustrated embodiment, the overcurrent protection circuit 145 may also be configured to generate a control signal 225 in the case of overcurrent detection. Thus, when the switch 205 (e.g., a SCR) turns on, voltage may be supplied to a Light Emitting Diode (LED) coupled to an optocoupler (e.g., optocoupler 410, as illustrated in FIG. 4). Accordingly, an external microcontroller 230 may use a signal to determine which load is on, when the overcurrent condition occurred. The microcontroller may also be configured to use this signal 225 to display the condition to the operator as well as initiate a diagnostic routine.

Figure 3:
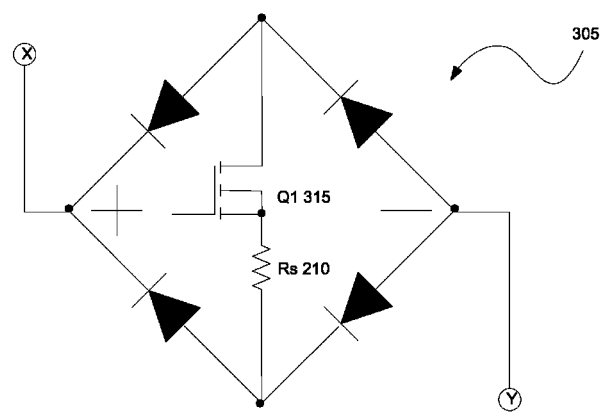
FIG. 3 is a circuit diagram of a rectifier bridge illustrated in accordance with an illustrated embodiment.

In implementation, the overcurrent protection circuit 145 may also include a bridge rectifier circuit 305 as illustrated in FIG. 3, to switch AC using the DC switching device. As illustrated in FIG. 3, the bridge rectifier includes Q1 315, configured to act as a DC switch.

FIG. 4 includes the components of FIGS. 1-3 in combination showing the bridge rectifier 315 (FIG. 3) coupled to the thyristors 110, 120, 130 (FIG. 1) and DC switching device 205 (FIG. 2). It should be appreciated that the particular circuit components utilized in an overcurrent protection circuit are based on the constraints of the apparatus in which the circuit is utilized. Therefore, the following illustrative values are provided only as a frame of reference for one of ordinary skill in the art.

It should be appreciated that, with the disclosed component configuration and values of FIG. 4, the overcurrent protection circuit will interrupt the current within 10 microseconds.

The DC switch is Q1 315, the bridge 305, and the threshold detector is an SCR designated as Q2 460. Thus, in implementation the current is detected by measurement of the voltage developed across Rs 210. When this voltage reaches the threshold detector gate turn-on voltage threshold, Q2 460 turns on and pulls down the voltage at the gate of Q1 315, causing it to turn off. Thus, it should be appreciated that changing the value of current sensing resistor Rs 210 or the ratio of resistor 415 to resistor 420 can vary the threshold.

Further, it should be appreciated that various alternative circuit configurations may be provided to provide various alternative functionality. For example, the resistance in the form of resistor 420 may be omitted entirely; alternatively, the values of resistances 415 and 420 may be selected so as to provide a voltage divider configuration so as to vary the threshold voltage required to trigger operation of Q2. Additionally, resistance in the form or resistor 415 and capacitance in the form of capacitor 465 may operate as a low pass filter configuration. The other components (470, 475) provided in FIG. 4 may also provide various voltage and current managing operations, and, therefore, are not required for embodiments of the invention.

Figure 5:
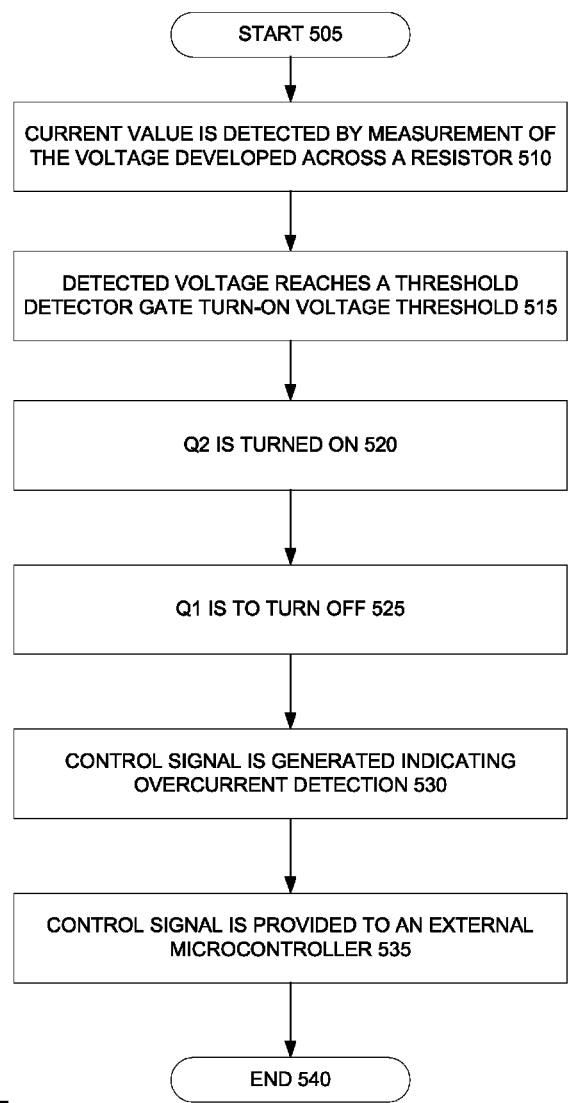
FIG. 5 is a functional flow chart illustrating operations performed in accordance with at least one embodiment.

In operation of the circuit illustrated in FIG. 4, when there is no overcurrent, the gate of Q1 315 is positive due to the voltage developed by diode 405, resistors 425, 430 and capacitor 435. Likewise, zener diode 440 limits this voltage to a predetermined maximum. Thus, it should be understood that components 405-455 are utilized for implementation of the overcurrent protection circuit and voltage and current balancing of the circuit. Therefore, these components and their relative configuration are not essential to the functionality of the invention. Accordingly, various component configurations may be provided in the overcurrent protection circuit without departing from the scope of the invention FIG. 5 illustrates a series of operations performed in accordance with an illustrated embodiment. As shown in FIG. 5, operations begin at 505 and control proceeds to 510 at which a current value is detected by measurement of the voltage developed across a resistor (e.g., Rs 210). Control then proceeds to 515, when the detected voltage reaches a threshold detector gate turn-on voltage threshold. Control then proceeds to 520, at which Q2 is turned on. As a result, at 525, Q1 is turned off. Control then proceeds to 530, at which a control signal is generated indicating overcurrent detection. Control then proceeds to 535, wherein the control signal is provided to an external microcontroller for use for maintenance personnel use and/or diagnostic routine analysis. Control then proceeds to 540, at which operations end.

For example, illustrative embodiments include a resistive element (e.g., resistor 210 illustrated in FIG. 2) in series with the apparatus switching devices to be protected, wherein the threshold detection circuit is configured to detect the voltage across the resistance to detect the overcurrent. However, it should be understood that the resistance may be replaced with any type of component that enables detection of voltage or current to determine whether overload current is occurring. For example, such components may include a hall effect sensor or a current transformer. Those particular examples are galvanically isolated, they could also be located anywhere in series with the X and Y connections with their outputs connected to the threshold detector 215; in this case resistor 210 would be replaced with a short circuit. It should be appreciated that, depending on the type of component used in this manner, costs of associated circuits may be increased and may necessitate additional supporting resistors, capacitors, etc.

The applicants have provided description and figures which are intended as illustrations of embodiments of the disclosure, and are not intended to be construed as containing or implying limitation of the disclosure to those embodiments. There are a plurality of advantages of the present disclosure arising from various features set forth in the description. It will be noted that alternative embodiments of the disclosure may not include all of the features described yet still benefit from at least some of the advantages of such features. Those of ordinary skill in the art may readily devise their own implementations of the disclosure and associated methods, without undue experimentation, that incorporate one or more of the features of the disclosure and fall within the spirit and scope of the present disclosure and the appended claims.

The invention claimed is:

1. An overcurrent protection circuit for protecting a plurality of apparatus switching devices from alternating current overload, the circuit comprising:
   an auxiliary direct current switching device;
   a first component sensor located in proximity to at least one of the plurality of apparatus switching devices;
   a threshold detection circuit coupled to the first component; and
   a controller circuit provided in series with the plurality of apparatus switching devices,
   wherein the threshold detection circuit is configured to detect an indication of a current value flowing through at least one of the plurality of apparatus switching devices by detecting a current value flowing through the first component and to output a first control signal to the auxiliary direct current switching device to trigger the auxiliary direct current switching device to eliminate the alternating current overload in the plurality of apparatus switching devices, and
   wherein the controller circuit is configured to be reset and remove command signals from the plurality of apparatus switching devices in response to a power interruption resulting from the auxiliary direct current switching device's elimination of the alternating current overload in the plurality of apparatus switching devices.

2. The overcurrent protection circuit of claim 1, wherein the apparatus switching devices are thyristors.

3. The overcurrent protection circuit of claim 1, wherein the auxiliary direct current switching device is a transistor.

4. The overcurrent protection circuit of claim 1, wherein the auxiliary direct current switching device is a field effect transistor.

5. The overcurrent protection circuit of claim 1, wherein the overcurrent protection circuit is in series with at least one thyristor.

6. The overcurrent protection circuit of claim 1, further comprising a microcontroller configured to indicate an overcurrent condition to an operator.

7. The overcurrent protection circuit of claim 1, further comprising a microcontroller configured to initiate a diagnostic routine.

8. The overcurrent protection circuit of claim 1, further comprising a bridge rectifier configured to switch alternating current using the auxiliary direct current switching device.

9. A method of protecting a plurality of apparatus switching devices from alternating current overload, the method comprising:
   providing an auxiliary direct current switching device;
   placing a first component located in proximity to at least one of the plurality of apparatus switching devices; and
   placing a threshold detection circuit coupled to the first component,
   wherein the threshold detection circuit is configured to detect an indication of a current value flowing through the at least one of the plurality of apparatus switching devices based on measurement of a characteristic of the first component and to output a first control signal to the auxiliary direct current switching device to trigger the auxiliary direct current switching device to eliminate the alternating current overload in the plurality of apparatus switching devices based on that detected current value, the method further comprising
   resetting a controller circuit provided in series with the plurality of apparatus switching devices so as to remove command signals from the plurality of apparatus switching devices in response to a power interruption resulting from the auxiliary direct current switching device's elimination of the alternating current overload in the plurality of apparatus switching devices.

10. The method of claim 9, wherein the apparatus switching devices are thyristors.

11. The method of claim 9, wherein the auxiliary direct current switching device is a transistor.

12. The method of claim 9, wherein the auxiliary direct current switching device is a field effect transistor.

13. The method of claim 9, wherein the overcurrent protection circuit is in series with at least one thyristor.

14. The method of claim 9, further comprising providing a microcontroller configured to indicate an overcurrent condition to an operator.

15. The method of claim 9, further comprising providing a microcontroller configured to initiate a diagnostic routine.

16. The method of claim 9, further comprising providing a bridge rectifier configured to switch alternating current using the auxiliary direct current switching device.

17. A method of protecting a plurality of apparatus switching devices from alternating current overload, the method comprising:
   detecting an indication of a current value flowing through at least one of the plurality of apparatus switching devices based on a measured characteristic of a first component provided in proximity to at least one of the apparatus switching devices, wherein the first component is coupled to a threshold detection circuit;
   triggering operation of at least one auxiliary direct current switching device when the detected current reaches a threshold level of the at least one auxiliary direct current switching device, wherein the threshold detection circuit is configured to detect an indication of the current value flowing through the auxiliary direct current switching device based on the measured characteristic of the first component and to output a first control signal to the at least one auxiliary direct current switching device to trigger operation of the auxiliary direct current switching device to eliminate the alternating current overload in the plurality of apparatus switching devices; and
   resetting a controller circuit provided in series with the plurality of apparatus switching devices so as to remove command signals from the plurality of apparatus switching devices in response to a power interruption resulting from the auxiliary direct current switching device's elimination of the alternating current overload in the plurality of apparatus switching devices.

18. The method of claim 17, wherein the apparatus switching devices are thyristors.

19. The method of claim 17, wherein the first control signal being output to an external microcontroller for use for maintenance or diagnostic purposes.

20. The method of claim 17, wherein the auxiliary direct current switching device is a transistor.

21. The method of claim 17, wherein the auxiliary direct current switching device is a field effect Transistor.

22. The method of claim 17, wherein the overcurrent protection circuit is in series with at least one thyristor.

23. The method of claim 17, further comprising providing a microcontroller configured to indicate an overcurrent condition to an operator.

24. The method of claim 17, further comprising providing a microcontroller configured to initiate a diagnostic routine.

25. The method of claim 17, further comprising providing a bridge rectifier configured to switch alternating current using the auxiliary direct current switching device.

* * * * *